United States Patent
Suh et al.

(10) Patent No.: US 9,749,028 B2
(45) Date of Patent: Aug. 29, 2017

(54) SYSTEM AND METHOD FOR TRELLIS CODED QUANTIZATION BASED CHANNEL FEEDBACK

(71) Applicants: Jung Hoon Suh, Kanata (CA); Osama Aboul-Magd, Kanata (CA)

(72) Inventors: Jung Hoon Suh, Kanata (CA); Osama Aboul-Magd, Kanata (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/997,804

(22) Filed: Jan. 18, 2016

(65) Prior Publication Data

US 2017/0078010 A1 Mar. 16, 2017

Related U.S. Application Data

(60) Provisional application No. 62/216,921, filed on Sep. 10, 2015.

(51) Int. Cl.
*H04K 1/10* (2006.01)
*H04L 27/28* (2006.01)
*H04B 7/06* (2006.01)
*H04L 1/00* (2006.01)
*H03M 13/00* (2006.01)
(Continued)

(52) U.S. Cl.
CPC ...... *H04B 7/0619* (2013.01); *H03M 13/6577* (2013.01); *H04B 7/0417* (2013.01); *H04B 7/0658* (2013.01); *H04L 1/006* (2013.01); *H03M 13/41* (2013.01)

(58) Field of Classification Search
None
See application file for complete search history.

(56) References Cited

U.S. PATENT DOCUMENTS 6,501,860 B1 * 12/2002 Charrier ............... G06T 9/008
                                                         375/240.02
8,982,976 B2    3/2015 Suh et al.
(Continued)

FOREIGN PATENT DOCUMENTS

| CN | 101217304 A | 7/2008 |
| CN | 101262310 A | 9/2008 |
| WO | 2015010563 A2 | 1/2015 |

OTHER PUBLICATIONS

International Search Report for International Application No. PCT/CN2016/076094 dated May 30, 2016.

*Primary Examiner* — Shuwang Liu
*Assistant Examiner* — Gina McKie

(57) ABSTRACT

A method and apparatus for feeding back channel information from a first device to a second device in a wireless communication system are provided. The first device estimates channel parameters based on a signal received from the second device, and determines a set of angle parameters indicative of an angle representation of a V matrix, which is the right singular matrix of a singular value decomposition of an estimated channel matrix H. The angle parameters can be derived according to a Givens rotation method or Cosine-Sine decomposition. The first device applies a Trellis Coded Quantization (TCQ) scheme to map the angle parameters to a trellis. A Viterbi algorithm applied to the trellis generates quantized angle parameters which are transmitted to the second device.

19 Claims, 9 Drawing Sheets

(51) Int. Cl.
*H04B 7/0417* (2017.01)
*H03M 13/41* (2006.01)

(56) References Cited

U.S. PATENT DOCUMENTS

| | | | |
|---|---|---|---|
| 2008/0043873 A1* | 2/2008 | Ariyavisitakul | H04B 7/0617 375/267 |
| 2008/0212461 A1* | 9/2008 | Pande | H04B 7/0626 370/203 |
| 2015/0124894 A1 | 5/2015 | Suh et al. | |

* cited by examiner

US 9,749,028 B2

SYSTEM AND METHOD FOR TRELLIS CODED QUANTIZATION BASED CHANNEL FEEDBACK

RELATED APPLICATIONS

This patent application claims priority to U.S. Patent Application No. 62/216,921, filed on the 10 Sep. 2015 and entitled "SYSTEM AND METHOD FOR TRELLIS CODED QUANTIZATION BASED CHANNEL FEEDBACK", which is hereby incorporated by reference herein as if reproduced in its entirety.

FIELD OF THE INVENTION

The present invention pertains to the field of digital communications and in particular to a method and apparatus for trellis coded quantization-based channel feedback.

BACKGROUND

New technologies such as coordinated multi-point (CoMP), interference alignment (IA), dirty paper coding (DPC), and massive multiple-input multiple-output (MIMO), may be some of the keys to capacity enhancement for wireless communication systems. However, all of the benefits provided by these technologies may not be realized due to the requirements for precise channel knowledge.

Various wireless communication systems have been proposed in which a receiver estimates channel state information, for example based on transmitted pilot sequences, and transmits quantized estimates back to a transmitter, the transmitter then adjusting its operation according to the fed-back channel state information. Current approaches for providing channel feedback can be cumbersome in terms of their bandwidth requirements. More bandwidth-efficient approaches could liberate channel resources for other uses.

Therefore there is a need for a method and apparatus for providing channel feedback, that is not subject to one or more limitations of the prior art.

This background information is provided to reveal information believed by the applicant to be of possible relevance to the present invention. No admission is necessarily intended, nor should be construed, that any of the preceding information constitutes prior art against the present invention.

SUMMARY

An object of embodiments of the present invention is to provide a method and apparatus for trellis coded quantization-based channel feedback. In accordance with embodiments of the present invention, there is provided a method, in a first device, for providing channel feedback from the first device to a second device in a wireless communication system. The second device may use the channel feedback to adjust wireless transmission to the first device. The method includes: receiving a signal from the second device; estimating channel parameters for the signal; determining, based on the channel parameters, a set of angle parameters indicative of an angle representation of a V matrix, the V matrix being a right singular matrix of a singular value decomposition of a channel matrix H of the estimated channel parameters; mapping the set of angle parameters to a trellis in accordance with a Trellis Coded Quantization (TCQ) scheme; applying a Viterbi algorithm to the trellis to generate quantized angle parameters; and transmitting the quantized angle parameters to the second device.

In accordance with embodiments of the present invention, there is provided a first device of a wireless communication system, the first device including: a receiver configured to receive a signal from the second device; a channel estimation unit configured to estimate channel parameters for the signal; an angle derivation unit configured to determine, based on the channel parameters, a set of angle parameters indicative of an angle representation of a V matrix, the V matrix being a right singular matrix of a singular value decomposition of a channel matrix H of the estimated channel parameters; a quantization unit configured to map the set of angle parameters to a trellis in accordance with a Trellis Coded Quantization (TCQ) scheme and apply a Viterbi algorithm to the trellis to generate quantized angle parameters; and a transmitter configured to transmit the quantized angle parameters to the second device. The first device may include a processor and a memory component storing program instructions for execution by the processor to cause the first device to execute the operations of the various units set forth above.

BRIEF DESCRIPTION OF THE FIGURES

Further features and advantages of the present invention will become apparent from the following detailed description, taken in combination with the appended drawings, in which.

It will be noted that throughout the appended drawings, like features are identified by like reference numerals.

DETAILED DESCRIPTION

Figure 1:
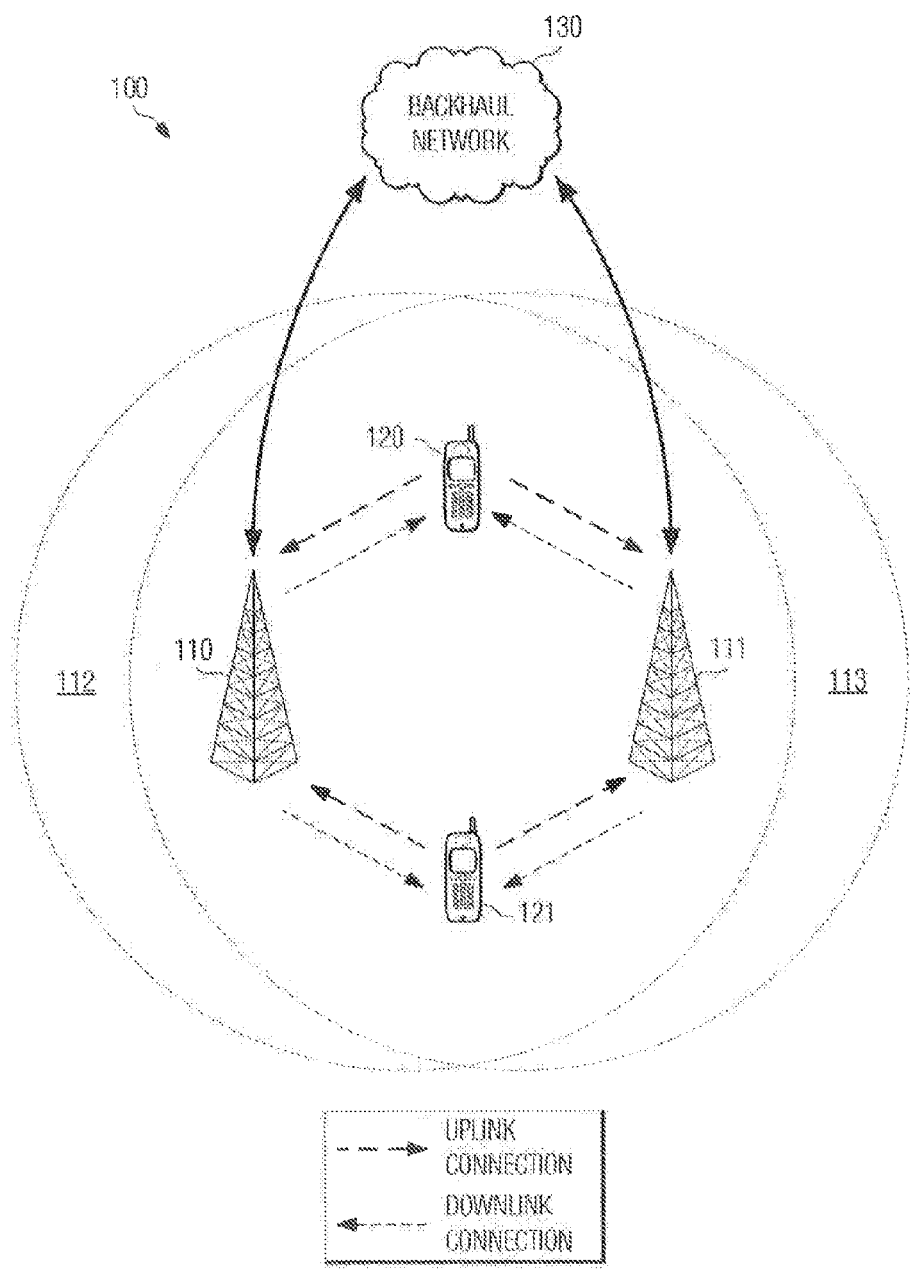
FIG. 1 illustrates a communication system in accordance with embodiments of the present invention.

Embodiments of the present invention provide for a method and apparatus for providing channel state information in a wireless communication system. More particularly, embodiments of the present invention relate to the encoding and/or quantization of channel state information as estimated by a receiver, for feeding back to a transmitter. In various embodiments, data representative of a V matrix is generated or otherwise provided, the V matrix representing the right singular matrix of a Singular Value Decomposition (SVD) of a channel matrix H representing the estimated channel parameters. In various embodiments, the data corresponds to angle parameters indicative of an angle representation of V, and some embodiments of the present invention comprise generating such angle parameters and/or such a representation of V. A trellis-coded quantization operation is performed on the data with mapping of the data to a trellis. A Viterbi algorithm is applied to the trellis to generate quantized versions of the data, such as quantized angle parameters. The quantized data can then be transmitted from the receiver to the transmitter.

Embodiments of the present invention will be described with respect to example embodiments in a particular context, namely wireless communication systems that use channel state information to facilitate advanced beamforming (BF) techniques or advanced communication techniques. Embodiments of the present invention may be applied to standards-compliant communication systems, such as those that are compliant with standards set by the Third Generation Partnership Project (3GPP), IEEE 802.11, or the like. Embodiments of the present invention may be applied to various communication systems that use channel state information to facilitate advanced BF techniques or advanced communication techniques.

Typically, two pieces of information are fedback to the transmitter for use in beamforming feedback in accordance with schemes for providing channel state information. Such a scheme is described, for example, in the IEEE 802.11ac standard. These pieces of information are the V matrix, which is communicated once every sub-carrier, and the Eigenvalues (nonzero entries of $\Sigma$) which are communicated once every second sub-carrier. Embodiments of the present invention are directed toward the V matrix feedback.

According to various embodiments of the present invention, a receiver receives a signal from a transmitter, estimates channel parameters from the signal as received, maps the estimated channel parameters to a trellis in accordance with a Trellis Coded Quantization (TCQ) scheme, applies a Viterbi algorithm (VA) to the trellis to generate quantized channel parameters, and transmits the quantized channel parameters and the indicators to the transmitter. As another example, the transmitter receives channel information for a communication channel, the channel information including quantized channel parameters, and generates reconstructed channel parameters from the quantized channel parameters.

Generally, in order to obtain channel state information, a transmitter (such as an Access Point (AP) when it is transmitting to a station in a downlink or station when it is transmitting to AP in an uplink) transmits to a receiver over a communication channel (or link) and the receiver utilizes the transmission to measure the communication channel. The receiver uses the channel measurement to derive channel state information and transmits the channel state information (or a function thereof) to the transmitter. The channel state information is included in the channel feedback provided from the receiver to the transmitter. The transmitter may use the channel feedback to adjust its transmitter to fully exploit advanced communication techniques, such as BP, CoMP, MU-MIMO, single user MIMO, and the like.

In general, transmitters that are to use advanced communications techniques require information about the communication channels, such as MIMO channels, for transmitter beamforming (TxBF). This is especially true when advanced communications techniques, such as non-linear precoded MIMO, are to be applied, since full channel knowledge needs to be known at the transmitters. However, cost is an issue. The more accurate the channel knowledge, the larger the size of the channel feedback. Thereby increasing communication overhead and reducing communication system efficiency.

CO-assigned U.S. patent application Ser. No. 13/947,721, fried Jul. 22, 2013, entitled "Systems and Methods for Trellis Coded Quantization Based Channel Feedback," discloses the use of TCQ to quantize channel feedback. The use of TCQ helps to reduce the size of the channel feedback to about 10% of the current specified IEEE 802.11n full channel knowledge feedback size while still accommodating the application of any kind of MIMO beamforming technique including even dirty paper coding (DPC), one of the most complicated non-linear type of MIMO precoding techniques.

Co-assigned U.S. patent application Ser. No. 14/070,233, filed Nov. 13, 2013, entitled "Systems and Methods for Trellis Coded Quantization with Selective Feedback and Interpolation," discloses the use of TCQ to quantize channel feedback, including identifying samples of quantized, estimated channel parameters having quantization errors above a predetermined threshold.

FIG. 1 illustrates an example communication system 100, in accordance with embodiments of the present Invention. Communication system 100 includes access points (APs) 110 and 111. As shown in FIG. 1, the APs can have overlapping coverage areas (coverage area 112 corresponding to AP 110 and coverage area 113 corresponding to AP 111). The APs may serve stations 120 and 121. Utilizing advanced communication techniques, a device may communicate with multiple APs. As shown in FIG. 1, station 120 may communicate with both AP 110 and AP 111. Similarly, station 121 may communicate with both AP 110 and AP 111. Transmissions from an AP to a station are referred to as downlink (DL) communications, and transmissions from a station to an AP are referred to as uplink (UL) communications. The APs may be connected to a backhaul network 130, which may provide functionality support such as mobility, authentication, authorization, as well as services, including data, information, and multimedia. In various embodiments, an AP may correspond to a base station, a NodeB, an evolved NodeB (eNB), a controller, a communication controller, or a similar device. Similarly, a station may be commonly referred to as a mobile station, a mobile, a subscriber, a user, a terminal, or a user equipment (UE).

While it is understood that communication systems may employ multiple APs capable of communicating with a number of stations, only two APs, and a number of UEs are illustrated for simplicity.

Figure 2:
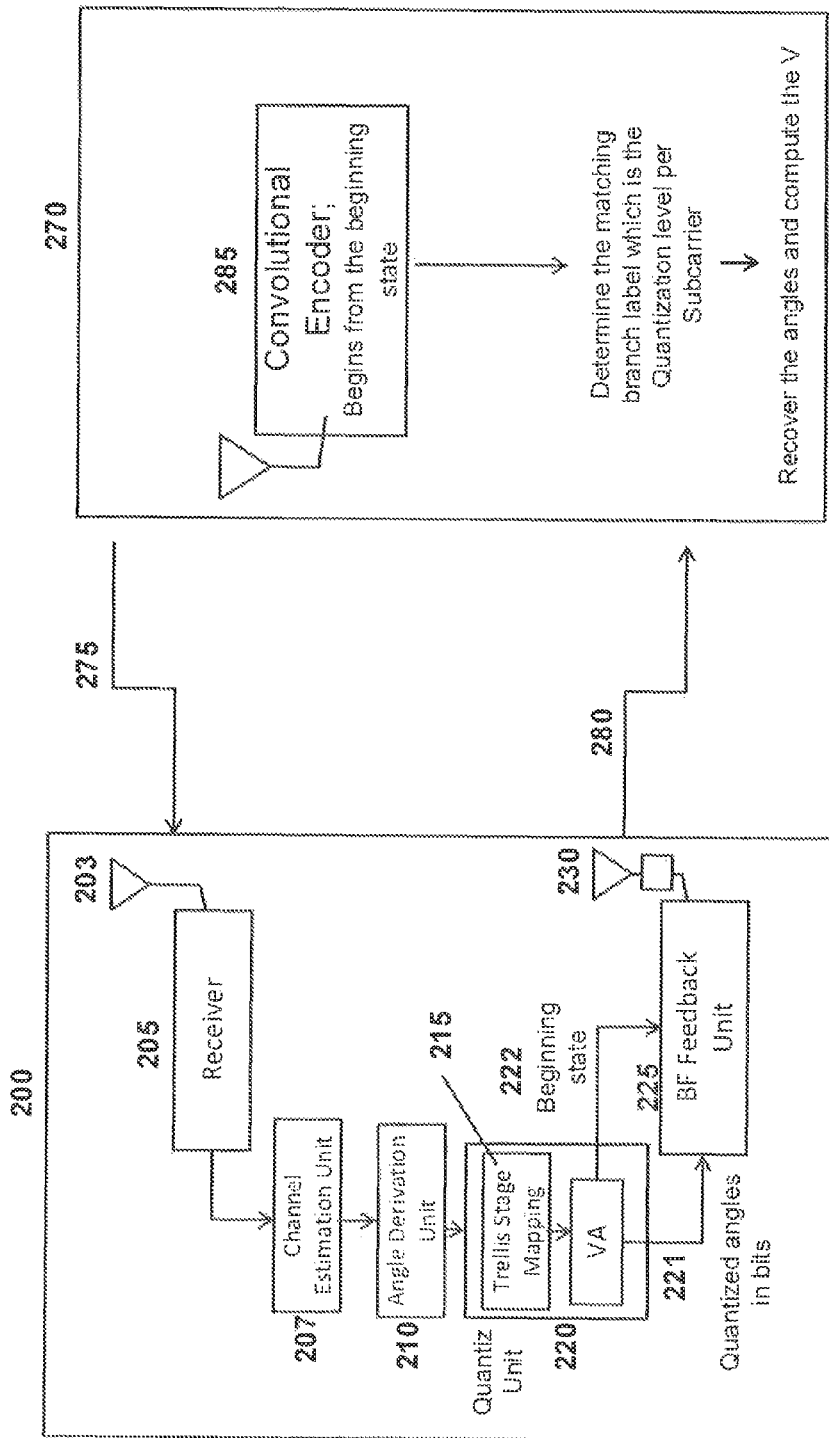
FIG. 2 illustrates another view of a communication system in accordance with embodiments of the present invention.

FIG. 2 illustrates a system provided in accordance with embodiments of the present invention. The system includes a first device 200 and a second device 270 in wireless communication with each other. The first device, such as a station (STA), receives, via a receiver 205 (and via a receive antenna 203) reference signals 275, such as Sounding Reference Signals, transmitted by the second device 270, and transmits, via a transmitter 230, channel feedback information 280 to the second device. The second device may be an access point, for example.

The first device 200 includes a channel estimation unit 207 configured to estimate channel parameters based on the received reference signals 275. The channel estimation unit provides output values corresponding to entries of the V matrix. The V matrix is obtained from the SVD of the channel matrix whose parameters are estimated by the channel estimation unit. The V matrix is the right singular matrix of the SVD of the channel matrix. The channel estimation unit may therefore perform the SVD operation in some embodiments. The estimated channel corresponds to the channel between the actual transmitter antenna of the second device and the receiver antenna of the first device.

The first device 200 includes an angle derivation unit 210 configured to receive, from the channel estimation unit, the output values corresponding to entries of the V matrix, and to compute an angle representation of the V matrix, or a matrix derived from V. The angle representation corresponds to a set of angle parameters which can be used to approximately or exactly reconstruct V, and hence can be used to efficiently communicate the V matrix. In various embodiments, the angle representation corresponds to a series of Givens rotation parameters. Angle parameters, such as but not necessarily limited to Givens rotation parameters or parameters resulting from a Cosine-Sine decomposition, are denoted herein as angle parameters $\Phi$ and $\Psi$. Use of Givens rotation or Cosine-Sine decomposition parameters to represent V would be readily understood by a worker skilled in the art. For example this approach has been used in the IEEE 802.11n and IEEE 802.11ac standards.

In various illustrative embodiments, therefore, the right-singular V matrix is represented as a series of Givens rotations whose parameters are relative phases, $\Phi$, and amplitudes, denoted by $\Psi$, between the various components of Eigenvectors.

The first device 200 includes a quantization unit 220, such as a Viterbi Algorithm (VA) unit, which performs trellis stage mapping 215 and determines, via the Viterbi Algorithm, the quantized angles in bits 221 and the beginning state 222, which are the two required pieces of information to be fed back to the access point for use in BF feedback. Trellis stage mapping involves receiving the angle parameters from the angle derivation unit and applying TCQ to each angle per sub-carrier. Each trellis stage corresponds to a respective sub-carrier. Alternatively, trellis stage mapping can be performed by a separate module or sub-function outside of the quantization unit. This information is passed to a BF feedback unit 225 of the first device and transmitted from a transmitter 230 of the first device to a receiver of the second device 270 as the feedback information 280.

The second device 270 includes a convolutional encoder 285 which periodically receives the feedback information 280, namely the quantized angles in bits 221 and the beginning state 222. The convolutional encoder then determines its outputs starting from the fed-back beginning state. The convolutional encoder outputs the matching branch label to each trellis stage, which corresponds to the quantization level per sub-carrier. Then the second device recovers the angle parameters (e.g. $\Phi$ and $\Psi$) and then the V matrix. The recovered V matrix is then used for BF computation.

It should be noted that the various units of the first device and second device, respectively, can be provided as aspects of common computing resources of the respective devices. For example, the first device can include a microprocessor operatively coupled to memory, or other electronic hardware, configured to execute the operations of one or multiple units as described above.

Figure 3:
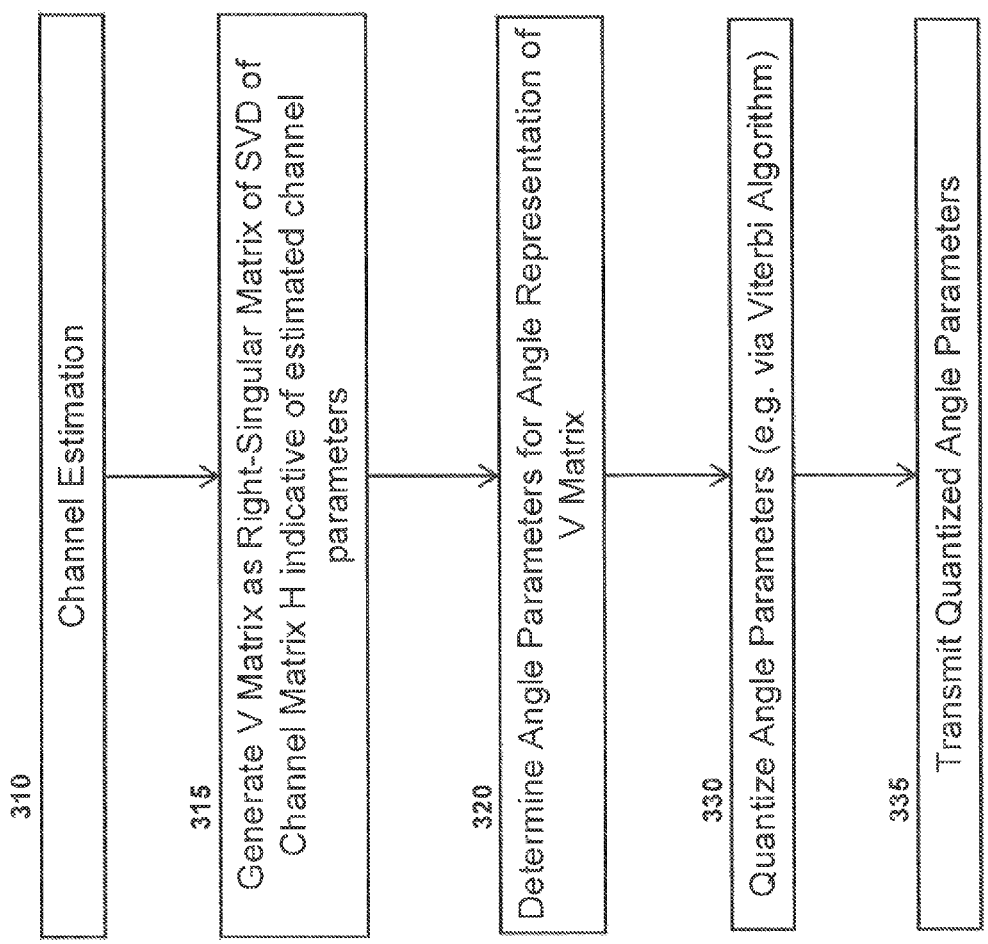
FIG. 3 illustrates operations occurring at a first device acting as a receiver providing channel feedback to a transmitter, in accordance with embodiments of the present invention.

FIG. 3 illustrates operations occurring at a first device acting as a receiver providing channel feedback to a transmitter, in accordance with embodiments of the present invention. The first device may be, for example, a UE or station in a downlink transmission or an eNB or AP in an uplink transmission, as the receiver provides channel feedback to a transmitter, such as an eNB or AP in a downlink transmission or a UE or station in an uplink transmission.

The operations include performing channel estimation 310. For example, in some embodiments, channel estimation includes receiving a signal from a second device. The signal may be a reference signal that is known to the receiver that is transmitted by the transmitter to assist the receiver in making its measurement of the channel. Channel estimation 310 may further include estimating channel parameters from the received signal. The first device may use the signal transmitted by the transmitter to measure the channel. Since the signal transmitted by the transmitter is known by the reception channel (e.g., the receiver knows the transmit power level, as well as properties of the signal), the receiver may be able to estimate the channel using the signal and the measurement of the channel, producing estimated channel parameters.

The operations further include generating 315 the V matrix corresponding to the right singular matrix of a SVD of a channel matrix H indicative of the estimated channel parameters. The operations further include determining 320 angle parameters indicative of an angle representation of the V matrix. For example, a Givens rotation or Cosine-Sine decomposition may be used to generate the angle representation, which comprises the determined set of angle parameters.

The trellis can be characterized using forward and backward state transition functions for example as given by Equations (2) and (3) set forth below. Each trellis stage corresponds to an angle parameter per tone, and multiple angle parameters cart be represented as required to characterize the V matrix. The operations further include quantizing 330 the angle parameters. The angle parameters may be mapped to a trellis using TCQ as described herein. According to an example embodiment, the quantization of the channel parameters may be achieved using a Viterbi algorithm (VA) that corresponds to the TCQ technique. The VA used may be specific to the trellis selected for use in the TCQ technique. As an illustrative example, the size (e.g., number of states, and number of branches), quantization levels, branch mappings, and the like, may determine a VA used. The operations further include transmitting 335 the quantized angle parameters to the second device, for example as part of transmitted channel feedback, such as beamforming feedback. The initial state information, indicative of an initial state of the trellis, may be transmitted along with the quantized angle parameters. The size of the initial state information depends on the number of states in the trellis. The size of the quantized angle parameter information depends on the number of angle parameters to be quantized, i.e. the trellis length, and the number of branches per state of the trellis.

Figure 4:
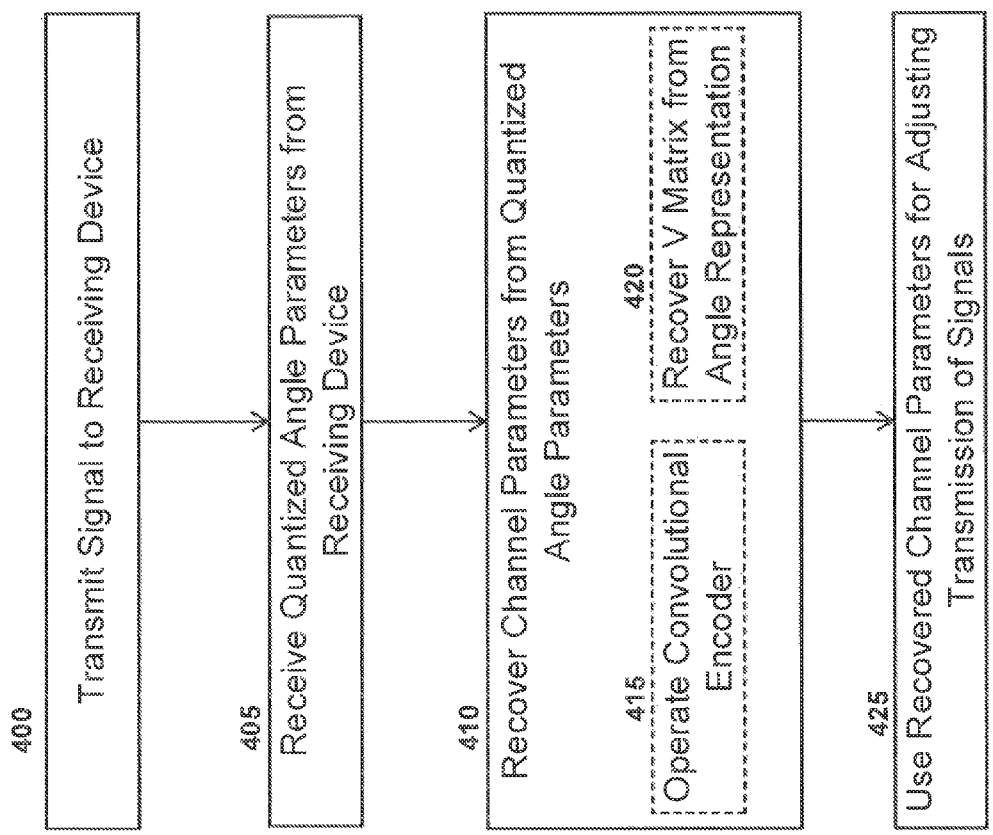
FIG. 4 illustrates operations occurring at a second device, acting as a transmitter, for receiving channel feedback and adjusting transmission operations, in accordance with embodiments of the present invention.

FIG. 4 illustrates operations occurring at a second device for receiving channel feedback and adjusting transmission operations, for example by using the channel feedback for beamforming, in accordance with embodiments of the present invention. The second device may be an eNB or AP in a downlink transmission or a UE or station in an uplink transmission.

The operations include transmitting 400 a signal to a first device. The signal may be a reference signal that is known by the receiver to assist the receiver in making measurements of a channel between the transmitter and the receiver. Alternatively, the signal may be regular transmissions from the transmitter to the receiver. The operations further include receiving 405 quantized angle parameters from the first device, for example as part of the beamforming feedback. The quantized angle parameters can be generated by the first device for example via the operations as described in FIG. 3. The channel feedback may also include initial state information, which is used to indicate an initial state of the trellis.

The operations further include recovering 410 channel parameters from the quantized angle parameters. In some embodiments, recovering the channel parameters can include operating 415 a convolutional encoder configured to use a copy of the same trellis having the same branch labels associated with angle parameters as described in FIG. 3. In some embodiments, recovering the channel parameters can include recovering 420 the V matrix from an angle representation thereof, for example via a reverse application of the Givens rotation or Cosine-Sine decomposition used by the first device to generate the angle representation. The operations further include using 425 the recovered V matrix for adjusting transmission of signals from the second device, for example by adjusting beamforming operations.

The V matrix can be derived from a channel matrix H via a singular-value-decomposition operation. The channel matrix H can represent an estimate of channel conditions, and may be derived in various ways by a wireless device. For example, the wireless device may receive known reference (e.g. pilot) sequences from one or more transmitters, and may generate the channel matrix H via least-squares estimation or minimum mean-squared error estimation based on the reference sequences. The channel matrix H is typically an estimate of the theoretical true channel matrix.

Embodiments of the present invention involve an explicit channel feedback scheme which utilizes an angle-quantized V matrix which is obtained from a Singular Value Decomposition (SVD) of a matrix H of estimated channel parameters. As used herein, and using standard, notation as would be readily understood by a worker skilled in the art, the V matrix is obtained in accordance with the SVD as represented by:

$$H = U\Sigma V^H. \quad (1)$$

Here, U is a square unitary matrix, $\Sigma$ is a rectangular diagonal matrix of non-negative numbers, and $V^H$, the conjugate transpose of V, is another square unitary matrix. As will be readily understood by a worker skilled in the art, the columns of V can be referred to as the right-singular vectors of H, i.e. the eigenvectors of $H^H H$.

It should be appreciated that the techniques described herein can be applied to generate an indication of a matrix other than the right-singular V matrix, by deriving a set of angle parameters corresponding to an angle representation of that matrix and then applying trellis coded quantization to the set of angle parameters, as described herein.

Embodiments of the present invention involve determining data representative of the V matrix. In various embodiments, this data is expressed as a set of angle parameters indicative of an angle representation of the V matrix.

In some embodiments, the angle representation of V is indicative of a series of Givens rotations whose parameters are relative phases, $\Phi$, and amplitudes, denoted by $\Psi$, between the various components of Eigenvectors of V. Such a data representation corresponds to a compressed angle representation of V, and can be computed in a manner as would be readily understood by a worker skilled in the art. For example, the IEEE 802.11ac standard specifies approaches for representing V using angle parameters $\Phi$ and $\Psi$ in accordance with an application of Givens rotations. In various embodiments, $\Phi$ is distributed over the range of $[0, 2\pi]$, and $\Psi$ is distributed over the range of $[0, \pi/2]$. As such, the TCQ scheme can be applied to the various distributions of sources. Example embodiments of the present invention as presented below therefore utilize the above angle ranges, although it will be readily appreciated that other angle ranges can be utilized.

In some embodiments, the angle representation of V corresponds to a Cosine-Sine decomposition of V. The Cosine-Sine decomposition of a matrix can be computed as would be readily understood by a worker skilled in the art. The output of the decomposition can be represented by parameters which can again be denoted $\Phi$ and $\Psi$, and which are distributed over specified ranges.

Other representations of V may be generated and subjected to trellis-coded quantization as described herein. In various embodiments, it is observed that the above-described angle parameters representative of the V matrix can have various probability distributions. A TCQ as described herein may operate desirably well on the various distributions of samples, and may further operate desirably well with memoryless Gaussian sources.

Embodiments of the present invention comprise an angle quantization of the orthonormal matrix, particularly for the right singular matrix, V, after the singular value decomposition (SVD). It is recognized by the inventors that, because of the distribution of this quantization with respect to various statistics, it can be used effectively with Trellis Code Quantization (TCQ).

As an example, for single user (SU) multiple-input multiple-output (MIMO) BF feedback, the average bit resolutions for $\Phi$ and $\Psi$ are usually 4 and 2 bits per angle and per sub-carrier, even though the bit resolution requirement for the multiple user (MU) MIMO can be higher. The eigen-BF (EGBF) based on the feedback V matrix is less sensitive to the channel variations, and for the closed loop (CL) SU-MIMO, the low bit resolution such as 4 and 2 bits per angle can be acceptable.

It is contemplated that embodiments of the present invention may lead to a performance improvement when the actual angle samples are Gaussian-distributed. Further, it Is contemplated that Eigen-beamforming can be relatively less sensitive to channel variations. For CL single-user MIMO communications, a low bit resolution for the beamforming feedback may be acceptable.

According to embodiments of the present invention, a particular trellis scheme is used for TCQ based quantization of the V matrix. This trellis scheme may be compared with the trellis scheme as set forth in the IEEE 802.11 standard for Bitwise Convolutional Coding (BCC) codes. One example trellis scheme is a 64-state and 2-branches-per-node trellis. However, it is contemplated that embodiments of the present invention may be applied to various types of trellises with various sizes of states and branches.

Embodiments of the present invention involve applying a Trellis Coded Quantization (TCQ) scheme to a given set of angle parameters, such as angle parameters $\Phi$ and $\Psi$ corresponding to an angle representation of the V matrix. The TCQ scheme maps the given angle parameters to a trellis code representation thereof. In various embodiments, a first TCQ scheme is applied to angle parameters $\Phi$, and a second, potentially separate TCQ scheme is applied to angle parameters Ψ. Each TCQ scheme is typically applied to a plurality of angle parameters.

Applying the TCQ scheme involves the use of a trellis having a given number of stages, states per stage, and branches per state. The number of stages may be equal to one greater than the number of angle parameters to be quantized. The number of states per stage can be configured based on a desired granularity of the quantization, that is, a desired number of quantization levels to be used. For example, 64 states per stage may be used. The number of branches per state may be an integer multiple of two, and is equal to two in various embodiments described herein. In a balanced, uniform trellis, each state in all but the last stage has the same number of branches leading therefrom, and each state in all but the first stage has this same number of branches leading thereto.

Figure 5:
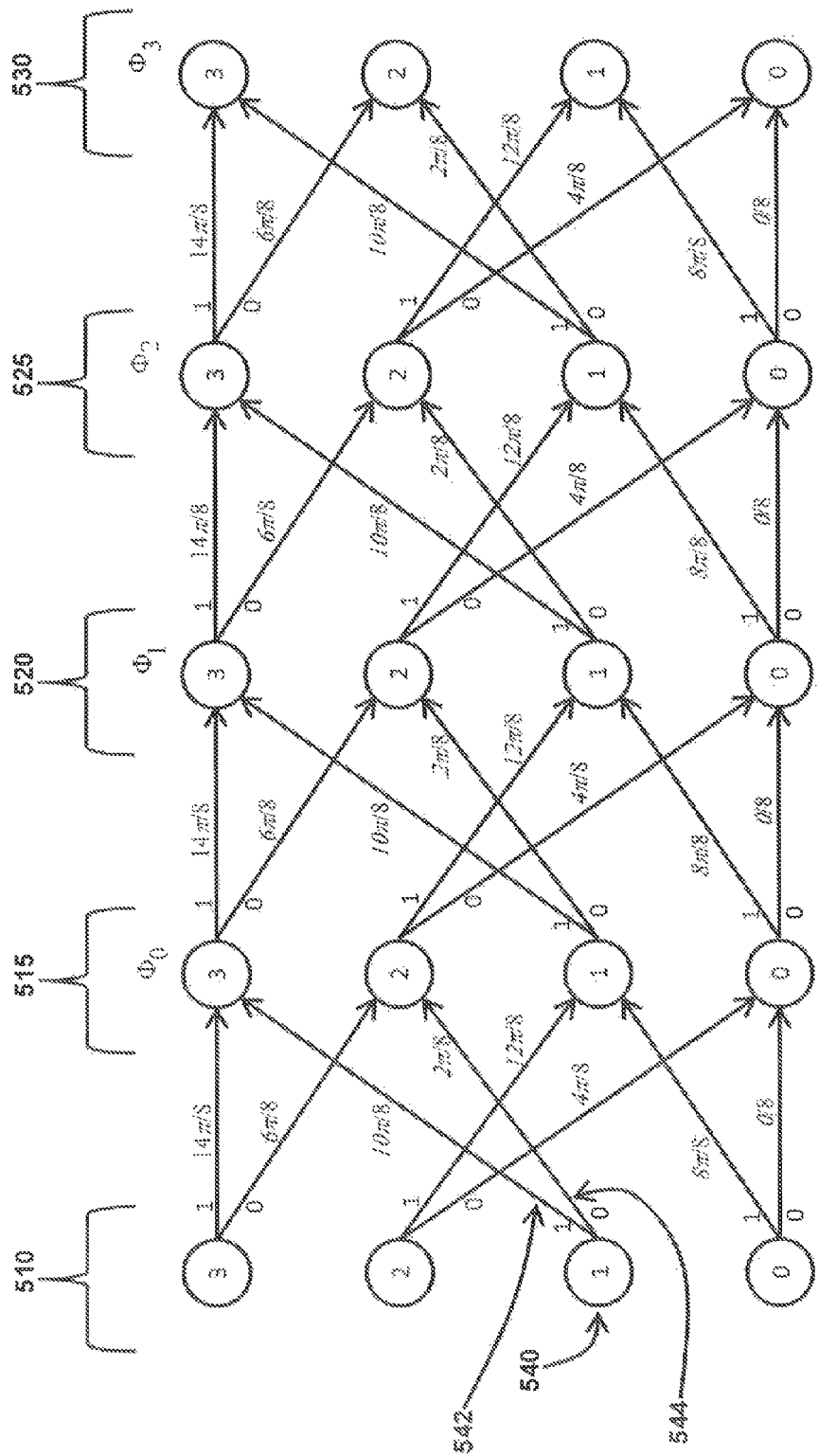
FIG. 5 illustrates a trellis and associated quantization levels, in accordance with an example embodiment of the present invention.
Figure 6:
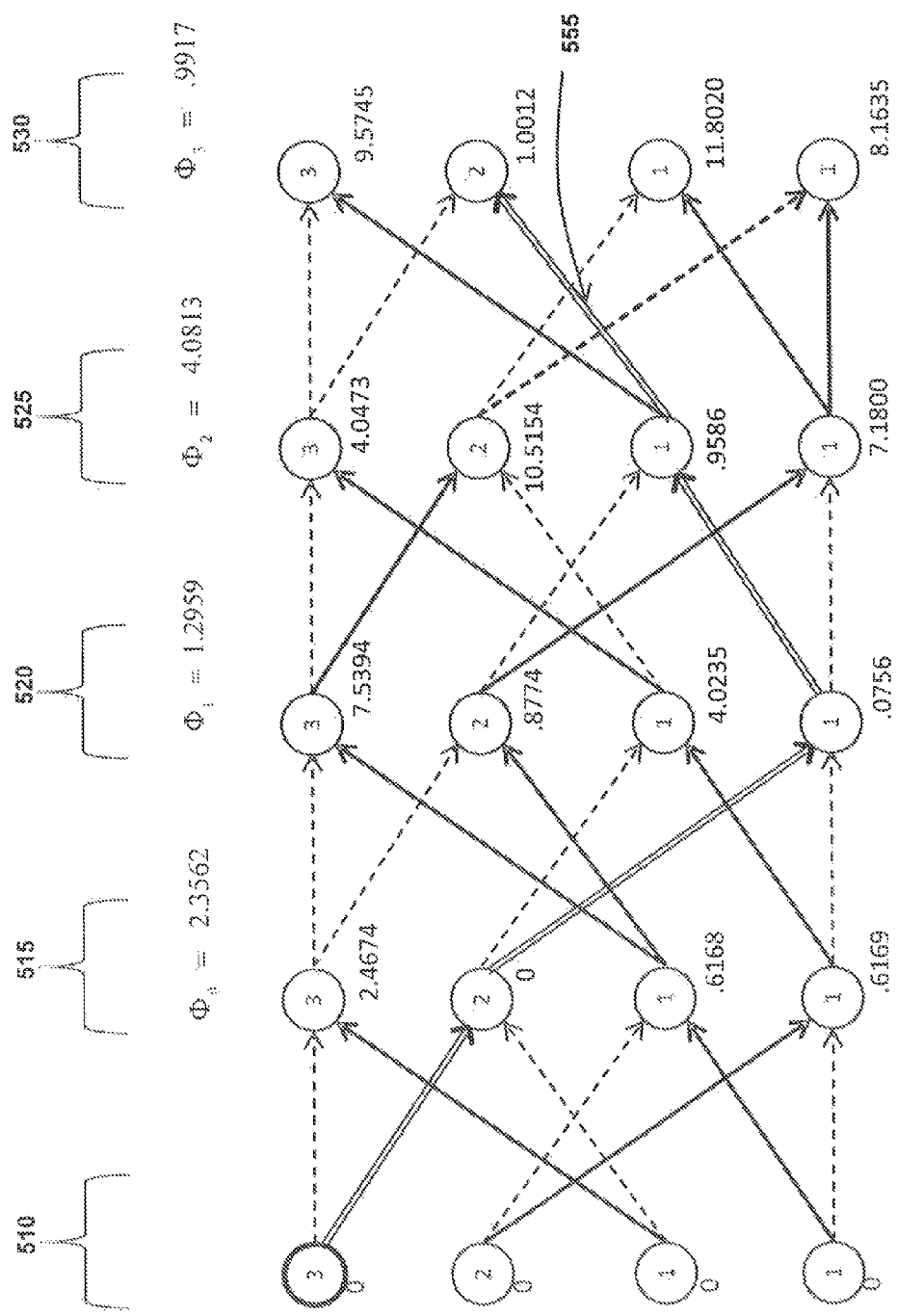
FIG. 6 illustrates an example of trellis coded quantization of a set of angle parameters using the example trellis of FIG. 5.

FIG. 5 illustrates a trellis provided in accordance with a simplified embodiment of the present invention for quantization of a set of four angle parameters $\Phi_0$, $\Phi_1$, $\Phi_2$, $\Phi_3$. The trellis includes five trellis stages (herein indexed from zero), four states per trellis stage, and two branches per state. The zeroth trellis stage 510 is an initial stage, the first trellis stage 515 can be used to represent the first angle parameter $\Phi_0$, the second trellis stage 520 can be used to represent the second angle parameter $\Phi_1$, the third trellis stage 525 can be used to represent the third angle parameter $\Phi_2$, and the fourth trellis stage 530 can be used to represent the fourth angle parameter $\Phi_3$. By way of example, two branches 542 and 544 lead from State "1" 540 of the zeroth trellis stage. Each state has two branches leading thereto, therefrom, or both. Each branch is associated with an angle-valued quantization level, expressed here in radians. Branch 542 is associated with quantization level $10\pi/8$, and $u_i=1$; branch 544 is associated with quantization level $2\pi/8$, and $u_i=0$. FIG. 6 illustrates a particular example of trellis coded quantization using the trellis illustrated in FIG. 5, which will be described in more detail later.

Figure 7:
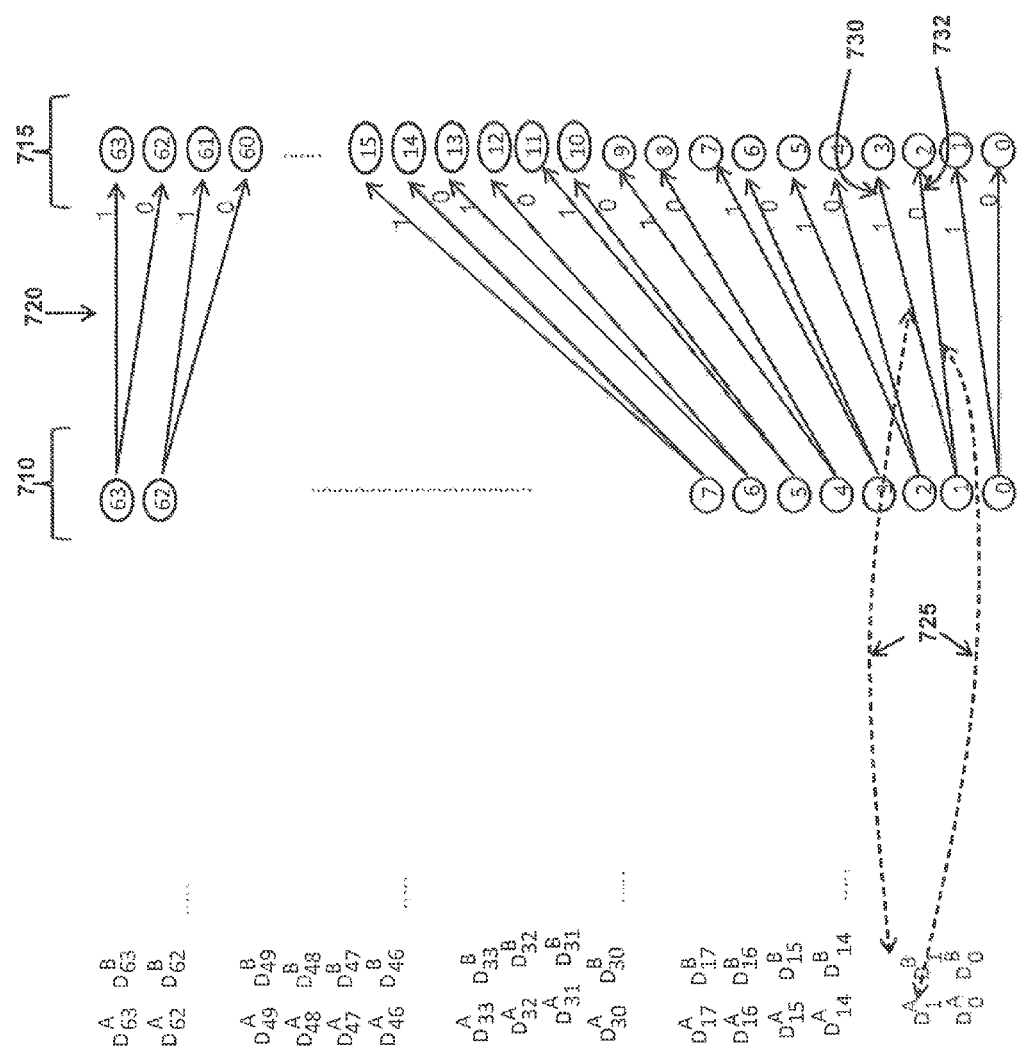
FIG. 7 illustrates two successive stages of a trellis, along with associated branch labels, in accordance with embodiments of the present invention.

FIG. 7 illustrates two successive trellis stages, each having 64 states per stage and two branches per state, in accordance with an embodiment of the present invention. The two successive trellis stages can form part of a trellis having a larger number of stages. Let $S_{i-1}$ be a variable representing one of 64 states in the $(i-1)^{st}$ trellis stage 710, and let $S_i$ represent one of 64 states in the $i^{th}$ trellis stage 715. Various enumerated states are illustrated for the two trellis stages. Each trellis stage corresponds to one phase angle per sub-carrier. For a trellis with N states per stage and B branches per state, the forward state transition function for the trellis is defined as:

$$S_i=(B*S_{i-1})\%N+u_i, u_i\in\{0,1,\ldots B-1\} \quad (2)$$

In the present illustrated example, N=64 and B=2. In another embodiment, N=64 and B=4. Other values are also possible. As used herein, the "%" operation refers to the modulo operation. The above state transition function defines the structure of the trellis branches, as illustrated in FIG. 7, in accordance with embodiments of the present invention. Namely, a branch exists from trellis state $S_{i-1}$ to trellis state $S_i$ whenever Equation (2) is satisfied with $u_i=0$ or $u_i=1$. Various branches 720 are illustrated with their corresponding $u_i$ values.

A backward state transition function can similarly be defined for the trellis as:

$$S_{i-1}=f(S_i,u_b)=\lfloor S_i/B \rfloor+N/B*u_b, u_n\in\{0,1,\ldots B-1\} \quad (3)$$

As used herein, $\lfloor \cdot \rfloor$ refers to the floor function. The backward state transition function can be used to reach a branch-connected trellis state $S_{i-1}$ in the $(i-1)^{st}$ trellis stage 710 from trellis state $S_i$ in the $i^{th}$ trellis stage 715. Here, $u_b$ represents the survival branch information for the backward trellis transition.

It will be readily understood by a worker skilled in the art that trellises with different numbers of states and/or different numbers of branches per state can be provided.

A trellis which is utilized according to embodiments of the present invention can be associated with a set of quantization levels as follows. A linear scalar quantization of angles falling between a minimum and maximum angle value is determined. The quantization of angles can correspond to a Lloyd-Max scalar quantizer. In various embodiments, the quantization level assignment may thus be assigned using the Lloyd-Max scalar quantizer, or optimized using a different quantizer. The values of the scalar quantization of angles, referred to herein as quantization levels, are used as branch labels of the trellis.

For example, for an angle parameter, such as Φ, which is represented as a value between 0 and $2\pi$ radians, and for a trellis having M branches per trellis stage (e.g. where the trellis has N states per stage and B branches per state, M=N·B), the uniformly distributed scalar quantization yields the following quantization levels:

$$Q_n = \frac{(n-1)}{M}2\pi, \quad n=1,2,\ldots M \quad (4)$$

As another example, for an angle parameter, such as Ψ, which is represented as a value between 0 and $\pi/2$ radians, and for a trellis having N branches per trellis stage, the uniformly distributed scalar quantization yields the following quantization levels:

$$Q_n = \frac{(n-1)}{M}\frac{\pi}{2}, \quad n=1,2,\ldots M \quad (5)$$

In each case, M quantization levels are defined, each quantization level corresponding to one of the M branches in each trellis stage. It is further noted that embodiments of the present invention involve applying different branch labels for the Φ and Ψ parameters. The provided quantization levels/branch labels are used for Viterbi algorithm branch metric computation. The quantization levels are allocated to the trellis diagram, by assigning quantization levels to corresponding outgoing branches of the trellis stages. As such, when there are M branches per trellis stage, the angle parameters represented by the trellis stages can be decomposed into M quantization levels. The quantization levels are equally-spaced, substantially span the potential range of the angle parameters being quantized, and are mapped to the trellis branches as branch labels in a manner which will be described below. For example, the M quantization levels can be assigned uniformly between 0 and $2\pi$ for the phase angle Φ, and assigned uniformly between 0 and $\pi/2$ for the phase angle Ψ.

In various embodiments, the quantization levels are assigned to the trellis branches in manner that satisfies the property that: the difference between the quantization levels associated with the branches leading out of a state is substantially independent of the state. For definiteness, this Independence property can hold for states selected from the same stage or from different stages of the trellis. In further embodiments, the quantization levels are assigned to the trellis branches in manner that also satisfies the additional property that: the difference between the quantization levels associated with the branches leading out of a state is substantially maximized. Referring to FIG. 5, it can be readily seen that the difference between the quantization levels assigned to the two trellis branches leading out of each illustrated state, of each illustrated stage, is equal to π.

In some embodiments, assignment of quantization levels to branches in manner that satisfies the above properties is performed as follows. For a set of equally spaced quantization levels $\{Q_n: n=1, 2 \ldots M\}$ (where $Q_n-Q_{n-1} \approx \Delta$ is substantially constant for all n), pairs of quantization levels, for assignment to a corresponding pair of branches leading out of the same state, can be defined by $(Q_k, Q_{k+M/2})$ for k=1, 2, . . . M/2. Then $Q_{k+M/2}-Q_k \approx (M/2)\Delta$ is substantially constant for all k and is substantially maximal. In various embodiments, for a given state, the quantization level $Q_{k+M/2}$ is assigned to the upper branch leading from that state, i.e. the branch associated with $u_i=1$ of Equation (2), and the quantization level $Q_k$ is assigned to the lower branch leading from that state, i.e. the branch associated with $u_i=0$ of Equation (2).

In some embodiments, when the trellis includes more than two branches per state, the quantization levels assigned to the multiple branches leading out of a state can be uniformly spaced. For example, four branches may correspond to four quantization levels $Q_a$, $Q_a+k\Delta$, $Q_a+2k\Delta$, $Q_a+3k\Delta$. The difference $k\Delta$ between adjacent quantization levels can be state-independent. In some embodiments, at least the difference between minimum and maximum quantization levels can be state-independent. For example, four branches may correspond to four quantization levels $Q_a$, $Q_b$, $Q_c$, $Q_a+l\Delta$, where $Q_a<Q_b<Q_c<Q_a+l\Delta$, and $l\Delta$ is state-independent, i.e. the same value for each state in the trellis. Trellis branch labels may be chosen in such a way to make the quantization levels distributed as sparsely as possible over all the states, that is, the quantization levels assigned to branches coming out of a trellis state should be selected to maximize a distance among the branches leading out of a trellis state. In general, having equal distances apart among the four branches will maximize the distance for all branches of the trellis, thereby distributing the quantization level in as sparse a manner as possible over all states.

Figure 8:
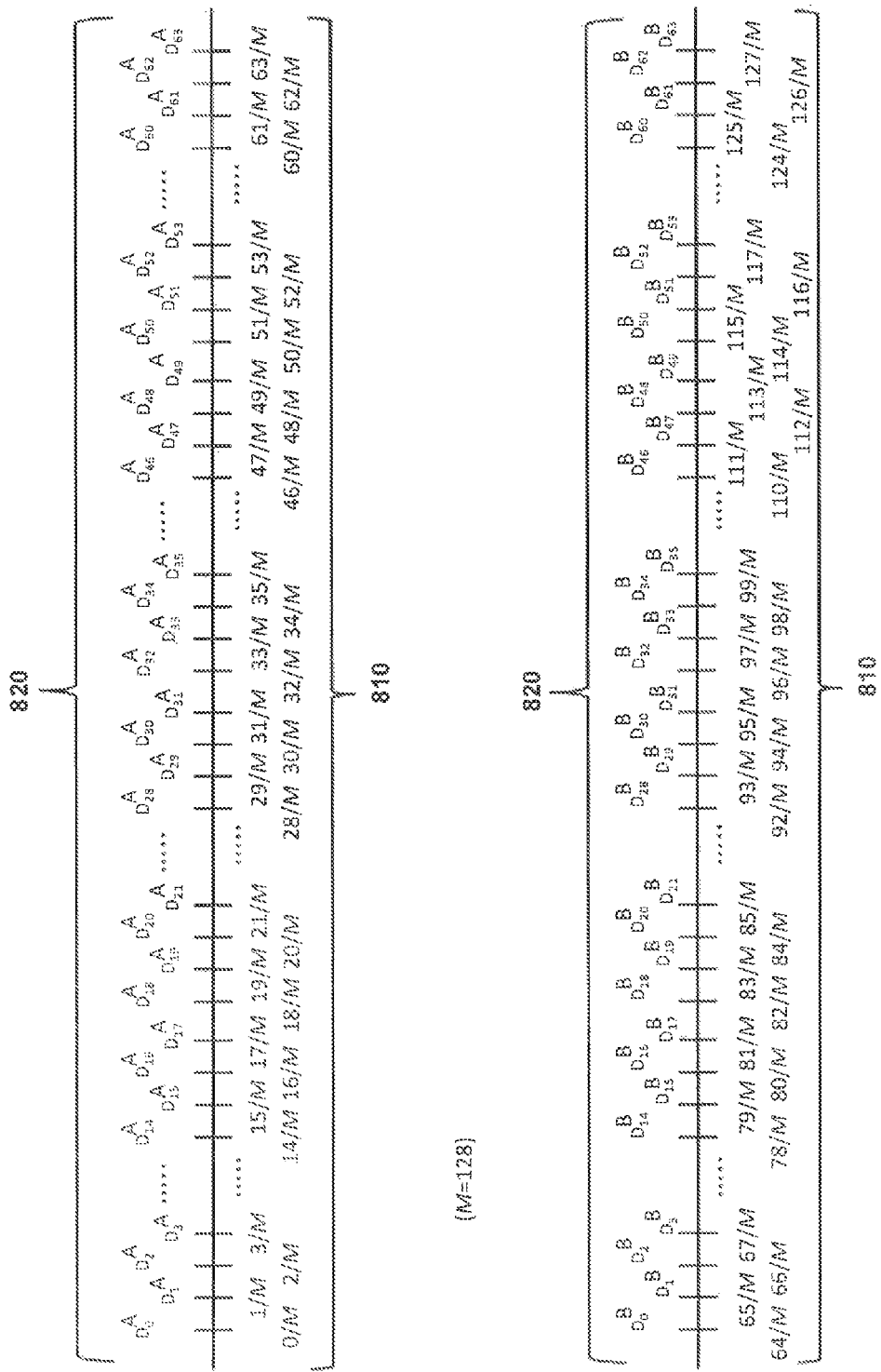
FIG. 8 illustrates assignment of quantization levels to trellis branches, in accordance with another embodiment of the present invention.

FIG. 8 illustrates assignment of quantization levels 810 to branch labels 820 according to another example embodiment of the present invention. The quantization levels correspond to quantizations of both angle parameters Φ and Ψ and are derived from Equations (4) and (5), respectively with M=128, corresponding to the trellis with 64 states and 2 branches per state. Factors of 2π and π/2 have been suppressed from the illustrated quantization levels for clarity. For angle parameter Φ of the Givens rotation, the quantization levels can be multiplied by 2π. For angle parameter Ψ of the Givens rotation, the quantization levels can be multiplied by π/2. Each quantization level corresponds to a branch label $D_k^B$ or $D_k^A$, as illustrated, for K=0, 1, . . . 63. For each k, branch label $D_k^A$ is assigned to the lower branch leading from state k of the $(i-1)^{st}$ trellis stage 710 illustrated in FIG. 7, and branch label $D_k^B$ is assigned to the upper branch leading from state k of the $(i-1)^{st}$ trellis stage 710. For further clarity, FIG. 7 illustrates the correspondence 725 between branch labels $D_1^A$ and $D_1^B$ and the branches 730, 732 leading out of State 1 of the (i-1)st trellis stage 710. More broadly, FIG. 7 also illustrates selected branch labels $D_k^B$, $D_k^A$ for k=0, 1, . . . 63.

Once the trellis scheme and its corresponding quantization points are obtained, a Viterbi Algorithm (VA) is operated to obtain the channel quantization bits. A back-trace VA is used to obtain the beginning state for the survival path in the total trellis. In various embodiments, in a typical bitwise channel decoder trellis diagram, input-output bits are assigned to each state transition branch based on its coding rate, and the VA determines the input bits based on the minimum Euclidean distance between the received signal bits and the corresponding channel encoder's output bit. A Log-likelihood ratio (LLR) computation may be used to extract soft-bit information when a higher QAM sized symbol is transmitted.

In embodiments of the present invention, the Euclidean distance is computed between the actual angle parameter and the branch label, the corresponding input, bits are determined based on this computed distance, and the corresponding input bits are used for the quantization bits.

In various embodiments, the back-traced VA is run over the total trellis length. It is not necessary to traverse the trellis starting from the state zero. For each state at the i–$1^{st}$ stage, and for each branch leading from the state, a corresponding node metric and branch metric are determined, respectively. For the zeroth stage, the node metric is zero, while for subsequent stages, the node metric is given by the previous stage's computations, as described below. The branch metric corresponds to the (possibly squared) Euclidean distance between the angle parameter corresponding to the $i^{th}$ stage and the quantization level/branch label for the branch. For each state at the $i^{th}$ stage, and for each branch leading to that state, a candidate node metric is computed as the sum of: the branch metric for that branch; and the node metric for the state (at the i–$1^{st}$ stage) from which the branch originates. The node metric (for the state at the $i^{th}$ stage) is set equal to the minimum candidate node metric. The branch corresponding to the minimum candidate node metric is saved as the survival branch leading to that state and stage of the trellis. As such, there will be one survival branch per node at each stage. There is a corresponding back-trace index for each branch, and this is saved as the survival branch information. This process is repeated to the end of the trellis.

Once the last trellis stage is reached, the node metrics are compared for all the states at the last trellis stage. One state with the minimum node metric is selected, so that the back trace travel, according to the backward state transition function for example of Equation (3), at the last stage might begin from the node with the minimum node metric. If the back-trace is begun from one node at the last stage, there is expected to be only one corresponding survival branch saved during the forward trellis transitions. Hence, thesis the survival branch information for the backward trellis transition.

When the trace back is performed, the node index reached at the last stage of the backward trellis becomes the beginning state (node) of the corresponding convolutional encoder. The index of the beginning state will be fedback to the second device (e.g. access point, base station, or other device performing convolutional encoding) together with the quantization bit per subcarrier and per phase angle. In various embodiments, the overall feedback information includes the 6 bit index of the beginning state (in the case of a 64-state trellis), plus 1 bit of quantization angle information per stage over the total trellis length f in the case of a rate ½ trellis scheme).

An example of the VA operation is described below, however, it should be noted that alternative formulations of the VA operation can also be allowed. FIG. 6 illustrates an example of trellis coded quantization of four angle parameters $\Phi_0$, $\Phi_1$, $\Phi_2$, $\Phi_3$ using the trellis illustrated in FIG. 5. In the present example, the values for the angle parameters are taken to be $\Phi_0$=2.3562 $\Phi_1$=1.2959, $\Phi_2$=4.0813, and $\Phi_3$=0.9917. A node metric g is computed for states of the trellis, and a branch metric d is computed for branches of the trellis. For each state in the initial (zeroth) trellis stage 510, the node metric g is set to zero. For each state $S_i$ in trellis stage/subsequent to the initial trellis stage, the node metric is set equal to:

$$g(S_i) = \min_{u_b \in U} \{g(f(S_i, u_b)) + d(i, S_i, u_b)\} \qquad (6)$$

Here, U is the set of possible values of $u_b$, for example U={0,1} in the two-branches-per-state embodiment. The function $f$ is the backward state transition function as in Equation (3). The branch metric d is a distance function of: the quantization level associated with that branch; and the angle parameter associated with the trellis stage to which that branch leads. In the present example, the distance function is equal to the square of the difference between the branch's quantization level and the angle parameter associated with the next trellis stage. That is:

$$d(i, S_i, u_b) = (\Phi_{i-1} - Q(S_i, u_b))^2. \qquad (7)$$

Here, $Q(S_i, u_b)$ is the quantization level associated with the branch propagating back from state $S_i$ for a given value of $u_b$, i.e. the branch which leads backward from $S_i$ to $f(S_i)$ for a given $u_b$ according to Equation (3). Computed values of $g(S_i)$ for the example case are illustrated below each state in FIG. 6.

Following computation of the node metrics, the trellis-coded quantization can be determined as follows. Among all states of the final stage of the trellis, the state having the smallest node metric, referred to herein as the end state, is determined. The survival path through the trellis leading from the initial trellis stage to the end state is also determined. The survival path can be determined by backward propagation through the trellis from the end state along those branches which correspond to the arguments of minimization in Equation (6), i.e. the survival branches. The survival branches are illustrated in FIG. 6 using solid lines, noting that there is one survival branch leading to each state for each stage following the zeroth stage. The survival path 555 for the example case is also illustrated on FIG. 6 using compound solid lines.

In general, given an end state $S^*_I$, the survival path can be defined by an initial state $S^*_0$ and a sequence of branching values $(u^*_0, u^*_1, \ldots u^*_{I-1})$ by the following process:

Initialize i=I;

While i>0;

$u^*_b(i) = \arg\min_{u_b \in U} \{g(f(S^*_i, u_b)) + d(i, S^*_i, u_b)\}$ $S^*_{i-1} = f(S^*_i, u^*_b(i))$ $u^*_{i-1} = S^*_i - (B \cdot S^*_{i-1}) \% N$ i=i-1.

Each value $(S^*_0, u^*_0, u^*_1, \ldots u^*_{I-1})$ can be represented as a value using multiple bits, and the binary representation can be transmitted as the trellis-coded quantization of the angle parameters. In particular, the angle parameters can correspond directly to the quantization levels associated with the trellis branches starting from $S^*_0$ and following the trellis according to the forward transition function given the sequence of inputs $u^*_0, u^*_1, \ldots u^*_{I-1}$.

In the example case illustrated in. FIG. 6, the survival path 555 is defined by initial state 3 (encoded as binary '11', for example) and branching values (0, 0, 1, 0). The branches of the survival path correspond to the sequence of quantization levels $$\left(\frac{6\pi}{8}, \frac{4\pi}{8}, \frac{8\pi}{8}, \frac{2\pi}{8}\right),$$

which is the resulting quantization of the sequence of angle parameters ($\Phi_0$, $\Phi_1$, $\Phi_2$, $\Phi_3$).

In various embodiments, after the TCQ based Quantization feedback is received at the second device (access point AP or base station BSS depending on the wireless system), the convolutional encoder corresponding to the VA used at each first device (station or UE) will determine the quantized angles. The convolutional encoder will begin from an initial state based on feedback information, with the input bits which are the output bits of the VA at each STA or UE. Branch labels are provided at each branch based on the quantizer's scheme and its quantization level. The beginning node and the input bits will determine the matching branch label, which will be the reconstructed phase angles at the second device.

It is noted that the quantization of the estimated channel parameters using the VA and the recovery of the channel parameters using the convolutional encoding may be performed in a sequential manner, with the VA providing the quantized channel parameters and the convolutional encoder providing the recovered channel parameters. Both the VA and the convolutional encoder may correspond to the TCQ technique described herein, as well as the trellis selected for use in the TCQ technique.

Once the trellis scheme, the number of angles, and the FFT size of an OFDM symbol are set, the total bit size of a TCQ based BF feedback can be obtained.

In some embodiments, the total amount of feedback per symbol for the TCQ-based channel feedback scheme is equal to $N_1 \cdot N_2 \cdot N_3 + I$, where $N_1$ is the number of output bits from the VA per trellis stage; $N_2$ is the number of subcarriers per OFDM symbol, that is the FFT size for an OFDM symbol; $N_3$ is the number of phase angles, depending on the MIMO configuration in use; and I is the number of indication bits for the beginning state of the survival path. For a 64-state trellis, I=6 is typical.

Table 1 presents a comparison of channel feedback (FB) sizes, in bits, between example embodiments of the present invention and existing feedback schemes provided in accordance with the IEEE 802.11ac standard, for 64 FFT OFDM symbols and a variety of MIMO configurations.

TABLE 1

| MIMO Size | Proposed TCQ based V FB (bits/symbol) | | Angle quantized V FB based on 802.11ac (bits/symbol) | | |
|---|---|---|---|---|---|
| | 1 | 2 | 4/2 | 5/3 | 6/4 |
| 2 × 2 | 134 | 262 | 384 | 512 | 640 |
| 3 × 3 | 390 | 774 | 1152 | 1536 | 1920 |
| 4 × 2 | 646 | 1286 | 1920 | 2560 | 3200 |
| 4 × 4 | 774 | 1542 | 2304 | 3072 | 3840 |

As shown in Table 1, the TCQ-based feedback scheme for V matrix angle parameters provides full channel state information feedback with significantly smaller channel feedback size. Additionally or alternatively, since embodiments of the present invention can provide more bandwidth-efficient channel feedback, channel feedback can be provided with an increased bit resolution, thereby reducing quantization noise.

It is noted that the current IEEE 802.11ac standard includes the following equations for $\Phi$ and $\Psi$:

$$\Phi = \frac{k\pi}{2^{b_\phi-1}} + \frac{\pi}{2^{b_\phi}}, \quad k = 0, 1, \ldots, 2^{b_\phi} - 1; \quad (8)$$

$$\Psi = \frac{k\pi}{2^{b_\psi+1}} + \frac{\pi}{2^{b_\psi+2}}, \quad k = 0, 1, \ldots, 2^{b_\psi} - 1.$$

Here, $b_\phi$ is the number of bits to quantize $\Phi$ and $b_\psi$ is the number of bits to quantize $\Psi$. According to embodiments of the present invention, formulations for $\Phi$ and $\Psi$ as described elsewhere above are used in place of the above Equations (8) for $\Phi$ and $\Psi$. That is, embodiments of the present invention comprise replacing the legacy IEEE 802.11ac formulation for $\Phi$ and $\Psi$ angle quantization with the TCQ scheme as described herein.

As can be seen from Table 1, embodiments of the present invention involve reducing the channel feedback size for beamforming by approximately ¼ compared to legacy IEEE 802.11ac feedback schemes, with comparable performance.

Embodiments of the present invention include data processing and/or signal processing operations which have been described herein using a mathematical paradigm. Various embodiments of the present invention include computing hardware configured to perform such operations. Examples of such computing hardware include, but are not necessarily limited to, a microprocessor configured to execute program instructions store in a memory, a digital signal processing circuit, a microcontroller, an application specific integrated circuit, a collection of digital and/or analog electronic components, or the like, or a combination thereof. For example, a communication device may include a processor and a memory component storing program instructions for execution by the processor to cause the communication device to perform operations involved in providing channel feedback.

Some embodiments of the present invention provide for a processing component of a wireless communication device, such as a Digital Signal Processor (DSP), the processing component is coupled to a radio transceiver for receiving radio signals therefrom and providing radio signals thereto. The processing component is configured to receive, from the radio transceiver, signal information (such as pilot sequences) indicative of the wireless communication channel between the wireless communication device and one or more other wireless communication devices. The processing component is further configured to generate data representative of a matrix V corresponding to the right singular matrix of a Singular Value Decomposition (SVD) of a channel matrix H. In various embodiments, the processing component derives the channel matrix H from the signal information. The data may be in the form of an angle representation of V, or another representation of V. The processing component is further configured to perform a trellis-coded quantization operation on the data to map the data to a set of trellis codes. The processing component is further configured to provide the trellis-coded data to the radio transceiver for transmission to the one or more other wireless communication devices. Various appropriate digital signal processor hardware which can be adapted to perform the processing operations as described herein would be readily understood by a worker skilled in the art.

Embodiments of the present invention provide for a wireless communication device, such as a station, User Equipment, terminal, or mobile station, or a system of wireless communication devices, including a first (reception) device and a second (transmission) device. At least the first device is configured as described herein, for example in accordance with the first device described with respect to FIG. 2.

Figure 9:
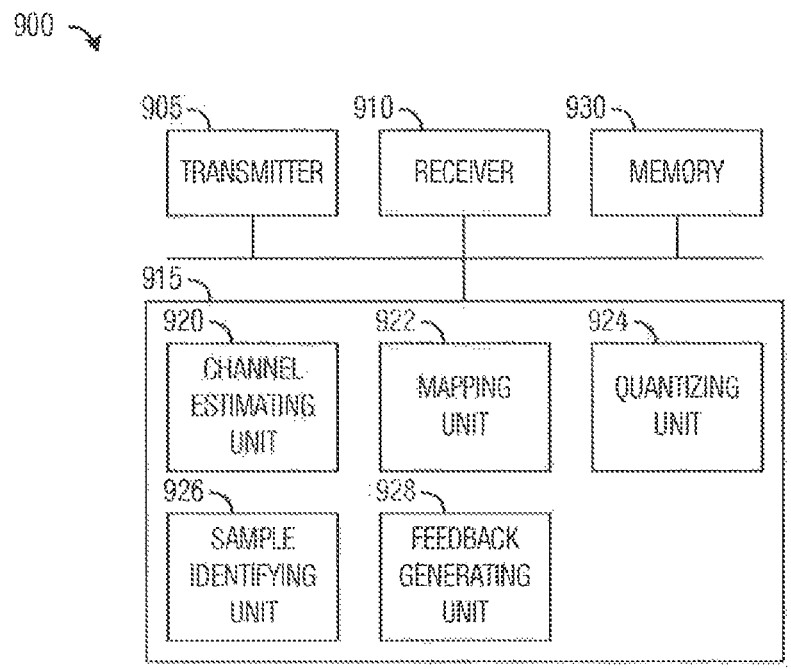
FIG. 9 illustrates a first communication device configured to provide channel feedback, in accordance with an embodiment of the present invention.

FIG. 9 illustrates a first communication device 900, in accordance with an embodiment of the present invention. Communication device 900 may be an implementation of a reception device, such as a station, a user equipment, a terminal, a subscriber, a mobile station, and the like on a downlink or an AP, a base station, a NodeB, an evolved NodeB (eNB), a controller, a communication controller, and the like, on an uplink. Communication device 900 may be used to implement various ones of the embodiments discussed herein. As shown in FIG. 9, a transmitter 905 is configured to transmit packets, channel feedback, and the like. Communication device 900 also includes a receiver 910 that is configured to receive packets, signals, and the like. The transmitter and receiver may be configured to communicate wirelessly via electromagnetic field propagation in the radio frequency, microwave frequency, or other frequency range.

A channel estimating unit 920 is configured to generate channel estimates in accordance with channel measurements made using a received signal, such as a reference signal. A mapping unit 922 is configured to map channel parameters to a trellis using a TCQ scheme. A quantizing unit 924 is configured to quantize channel parameters using a VA. A feedback generating unit 928 is configured to generate the channel feedback, which includes the quantized channel parameters. A memory 930 is configured to store signals, a trellis, VAs, convolutional encoders, channel parameters, channel feedback, and the like.

The elements of communication device 900 may be implemented as specific hardware logic blocks. In an alternative, the elements of communication device 900 may be implemented as software executing in a processor, controller, application specific integrated circuit, or so on. In yet another alternative, the elements of communication device 900 may be implemented as a combination of software and/or hardware.

As an example, receiver 910 and transmitter 905 may be implemented as a specific hardware block, while channel estimating unit 920, mapping unit 922, quantizing unit 924, sample identifying unit 926, and feedback generating unit 928 may be software modules executing in a microprocessor (such as processor 915) or a custom circuit or a custom compiled logic array of a field programmable logic array. Channel estimating unit 926, mapping unit 922, quantizing unit 924, sample identifying unit 926, and feedback generating unit 928 may be modules stored in memory 930.

Figure 10:
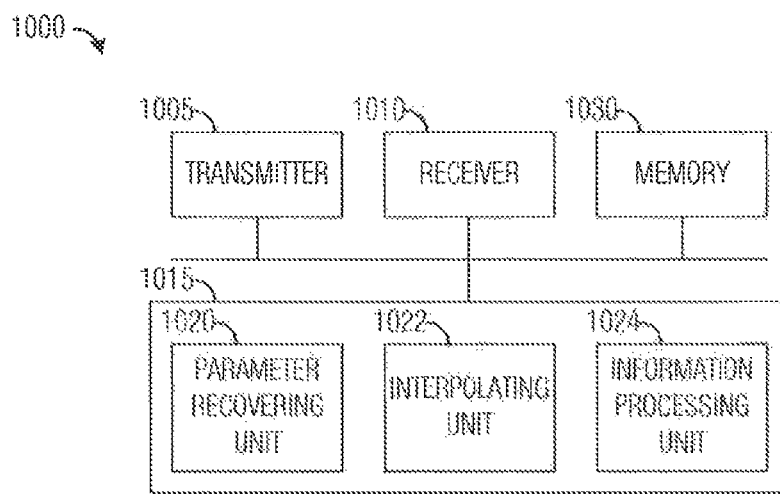
FIG. 10 illustrates a second communication device configured to use the provided channel feedback, in accordance with an embodiment of the present invention.

FIG. 10 illustrates a second communication device 1000, in accordance with an embodiment of the present invention. Communication device 1000 may be an implementation of a transmission device, such as a station, a user equipment, a terminal, a subscriber, a mobile station, and the like on uplink or an AP, a base station, a NodeB, an evolved NodeB (eNB), a controller, a communication controller, and the like, on a downlink. Communication device 1000 may be used to implement various ones of the embodiments discussed herein. As shown in FIG. 10, a transmitter 1005 is configured to transmit packets, signals, and the like. Communication device 1000 also includes a receiver 1010 that is configured to receive packets, channel feedback, and the like.

A parameter recovering unit 1020 is configured to recover channel parameters from quantized channel parameters received in channel feedback. Parameter recovering unit 1020 uses a convolutional encoder to recover the channel parameters. An information processing unit 1024 uses the recovered channel parameters to adjust transmitter 1005 to transmit to a receiver. A memory 1030 is configured to store signals, convolutional encoders, recovered channel parameters, a plurality of indicators, channel feedback, and the like.

The elements of communication device 1000 may be implemented as specific hardware logic blocks. In an alternative, the elements of communication device 1000 may be implemented as software executing in a processor, controller, application specific integrated circuit, or so on. In yet another alternative, the elements of communication device 1000 may be implemented as a combination of software and/or hardware.

As an example, receiver 1010 and transmitter 1005 may be implemented as a specific hardware block, while parameter constructing unit 1020, interpolating unit 1022, and information processing unit 1024 may be software modules executing in a microprocessor (such as processor 1015) or a custom circuit or a custom compiled logic array of a field programmable logic array. Parameter constructing unit 1020, interpolating unit 1022, and information processing unit 1024 may be modules stored in memory 1030.

Through the descriptions of the preceding embodiments, the present invention may be implemented by using hardware only or by using software and a necessary universal hardware platform. Based on such understandings, the technical solution of the present Invention may be embodied in the form of a software product. The software product may be stored in a non-volatile or non-transitory storage medium, which can be a compact disk read-only memory (CD-ROM), USB flash disk, or a removable hard disk. The software product includes a number of instructions that enable a computer device (personal computer, server, or network device) to execute the methods provided in the embodiments of the present invention. For example, such an execution may correspond to a simulation of the logical operations as described herein. The software product may additionally or alternatively include number of instructions that enable a computer device to execute operations for configuring or programming a digital logic apparatus in accordance with embodiments of the present invention.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

We claim:

1. A method in a first device for providing channel feedback from the first device to a second device in a wireless system, the method comprising:
   receiving a signal from the second device;
   estimating channel parameters for the signal;
   determining, based on the channel parameters, a set of angle parameters indicative of an angle representation of a V matrix, the V matrix being a right singular matrix of a singular value decomposition of a channel matrix H of the estimated channel parameters;
   mapping the set of angle parameters to a trellis in accordance with a Trellis Coded Quantization (TCQ) scheme;
   generating quantized angle parameters based on the trellis; and
   transmitting the quantized angle parameters to the second device.

2. The method of claim 1, wherein the angle parameters are derived from application of a Givens rotation operation on the V matrix.

3. The method of claim 1, wherein the angle parameters are derived from application of a Cosine-Sine decomposition operation on the V matrix.

4. The method of claim 1, wherein the set of angle parameters include a first type of angle parameter distributed over a first range and a second type of angle parameter distributed over a second range, wherein the first type of angle parameter is mapped to a first instance of the trellis by allocating quantization levels spanning the first range to branches of each stage of the trellis, and the second type of angle parameter is mapped to a second instance of the trellis by allocating quantization levels spanning the second range to branches of each stage of the trellis.

5. The method of claim 1, wherein mapping the set of angle parameters to the trellis comprises assigning quantization levels to branches leading out of states of the trellis, wherein, for each state, a difference between a maximum quantization level mapped to branches leading out of said state and a minimum quantization level mapped to branches leading out of said state is equal.

6. The method of claim 5, wherein the difference is maximized.

7. The method of claim 5, wherein the quantization levels are equally spaced.

8. The method of claim 1, wherein the trellis includes two outgoing branches per state.

9. The method of claim 1, wherein the quantized angle parameters are generated by an application of a Viterbi Algorithm to the trellis.

10. A first device of a wireless system, the first device configured to provide channel feedback to a second device in the wireless system, the first device comprising:
    a receiver configured to receive a signal from the second device;
    a channel estimation unit configured to estimate channel parameters for the signal;
    an angle derivation unit configured to determine, based on the channel parameters, a set of angle parameters indicative of an angle representation of a V matrix, the V matrix being a right singular matrix of a singular value decomposition of a channel matrix H of the estimated channel parameters;
    a quantization unit configured to map the set of angle parameters to a trellis in accordance with a Trellis Coded Quantization (TCQ) scheme and generate quantized angle parameters based on the trellis; and
    a transmitter configured to transmit the quantized angle parameters to the second device.

11. The first device of claim 10, wherein the angle parameters are derived from application of a Givens rotation operation on the V matrix.

12. The first device of claim 10, wherein the angle parameters are derived from application of a Cosine-Sine decomposition operation on the V matrix.

13. The first device of claim 10, wherein the set of angle parameters include a first type of angle parameter distributed over a first range and a second type of angle parameter distributed over a second range, the quantization unit further configured to map the first type of angle parameter to a first instance of the trellis by allocating quantization levels spanning the first range to branches of each stage of the trellis, and map the second type of angle parameter to a second instance of the trellis by allocating quantization levels spanning the second range to branches of each stage of the trellis.

14. The first device of claim 10, wherein the quantization unit is further configured to map the set of angle parameters to the trellis by assigning quantization levels to branches leading out of states of the trellis, wherein, for each state, a difference between a maximum quantization level mapped to branches leading out of said state and a minimum quantization level mapped to branches leading out of said state is equal.

15. The first device of claim 14, wherein the difference is maximized.

16. The first device of claim 14, wherein the quantization levels are equally spaced.

17. The first device of claim 10, wherein the trellis includes two outgoing branches per state.

18. The first device of claim 10, wherein the quantized angle parameters are generated by an application of a Viterbi Algorithm to the trellis.

19. A method in a first device for quantizing an angle representation of a V matrix, the V matrix being a right singular matrix of a singular value decomposition of a channel matrix H of estimated channel parameters, the method comprising:
 obtaining a set of angle parameters indicative of the angle representation of the V matrix;
 mapping the set of angle parameters to a trellis in accordance with a Trellis Coded Quantization (TCQ) scheme; and
 generating quantized angle parameters based on the trellis.

\* \* \* \* \*

UNITED STATES PATENT AND TRADEMARK OFFICE
CERTIFICATE OF CORRECTION

PATENT NO. : 9,749,028 B2
APPLICATION NO. : 14/997804
DATED : August 29, 2017
INVENTOR(S) : Jung Hoon Suh and Osama Aboul-Magd It is certified that error appears in the above-identified patent and that said Letters Patent is hereby corrected as shown below:

In the Specification

Column 9, Line 67, "$S_{i-1} = f(S_i, u_b) = [S_i/B] + N/B * u_b, u_n \in \{0,1, ...B-1\}$" should read -- $S_{i-1} = f(S_i, u_b) = [S_i/B] + N/B * u_b, u_b \in \{0,1, ... B-1\}$ --.

Column 10, Line 52, "Mb ranches" should read -- $M$branches --.

Signed and Sealed this
Twenty-first Day of November, 2017

Joseph Matal
*Performing the Functions and Duties of the*
*Under Secretary of Commerce for Intellectual Property and*
*Director of the United States Patent and Trademark Office*